(12) United States Patent
Cho et al.

(10) Patent No.: US 9,443,775 B2
(45) Date of Patent: Sep. 13, 2016

(54) LITHOGRAPHY PROCESS MONITORING OF LOCAL INTERCONNECT CONTINUITY

(71) Applicant: GlobalFoundries U.S. 2 LLC, Hopewell Junction, NY (US)

(72) Inventors: Hyun-Jin Cho, Guilderland, NY (US); Tenko Yamashita, Schenectady, NY (US); Chun-chen Yeh, Clifton, NY (US); Hui Zang, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 185 days.

(21) Appl. No.: 13/913,007

(22) Filed: Jun. 7, 2013

(65) Prior Publication Data
US 2014/0361298 A1    Dec. 11, 2014

(51) Int. Cl.
*H01L 21/66* (2006.01)

(52) U.S. Cl.
CPC .............. *H01L 22/14* (2013.01); *H01L 22/34* (2013.01); *H01L 22/12* (2013.01)

(58) Field of Classification Search
CPC ....... H01L 22/14; H01L 22/34; H01L 22/12; H01L 21/66
USPC .............................................. 257/48; 438/18
See application file for complete search history.

(56) References Cited

U.S. PATENT DOCUMENTS

| | | | |
|---|---|---|---|
| 4,855,253 A | 8/1989 | Weber | |
| 5,561,367 A | 10/1996 | Goettling et al. | |
| 6,509,197 B1 | 1/2003 | Satya et al. | |
| 6,515,495 B2 | 2/2003 | Richter | |
| 6,734,458 B2 * | 5/2004 | Kim et al. | 257/48 |
| 6,903,995 B2 | 6/2005 | Camerlenghi et al. | |
| 7,187,179 B1 | 3/2007 | Seaman et al. | |
| 7,531,449 B2 | 5/2009 | Park et al. | |
| 7,784,019 B1 | 8/2010 | Zach | |
| 8,349,674 B2 | 1/2013 | Ponoth et al. | |
| 2005/0199931 A1 * | 9/2005 | Lin | 257/301 |
| 2007/0020778 A1 * | 1/2007 | Yi | H01L 22/14 438/14 |
| 2007/0210306 A1 * | 9/2007 | Molinelli Acocella et al. | 257/48 |
| 2012/0223395 A1 | 9/2012 | Liaw | |

OTHER PUBLICATIONS

Michalka, T., et al., "A redundant metal-polyimide thin film interconnection process for wafer scale dimensions," IEEE Transactions on Semiconductor Manufacturing, vol. 3, No. 4, 1990, pp. 158-167.
Dai, H., et al., "Implementing self-aligned double patterning on non-gridded design layouts." Proc. SPIE 7275, Design for Manufacturability through Design-Process Integration III, Mar. 12, 2009, 72751E, 11 pages.

* cited by examiner

*Primary Examiner* — Asok K Sarkar
*Assistant Examiner* — Dmitriy Yemelyanov
(74) *Attorney, Agent, or Firm* — David A. Cain, Esq.

(57) ABSTRACT

Disclosed is a novel system and method to form local interconnects in a continuity test structure. The method begins with a first set of transistor gate lines and a second set of transistor gate lines are formed. Next, a first group of two or more local interconnect lines landing on transistor gates and formed substantially perpendicular to the first set of transistor gate lines and electrically coupled therewith is formed using a first lithography pass. A second group of two or more local interconnect lines landing and formed substantially perpendicular to the second set of transistor gate lines and electrically coupled therewith is formed during second lithography pass. For some technologies, a third set of transistor gate lines is formed along with a third group using a third lithography pass.

18 Claims, 6 Drawing Sheets

Proir Art

LITHOGRAPHY PROCESS MONITORING OF LOCAL INTERCONNECT CONTINUITY

BACKGROUND

The present invention generally relates to integrated circuits and to more specifically to yield testing of local interconnects.

Integrated circuits becomes smaller and smaller as technology allows device sizes to shrink. The quality of the dielectric and the control of local interconnects (LI) are key points for the reliability size reduction of integrated circuits.

Presently, local interconnect continuity is monitored during manufacturing through continuity measurements at a few locations on a few wafers of each lot. More specifically, yield testing or macro design for lithography process monitoring is an important to monitor to "local interconnect contact B" (LIB) landing on gate continuity and "Local interconnect contact A" (LIA) landing on source/drain region.

Previous yield testing processes or macro, such as "polycrystalline gate" (PC) LIB open macro, failure analysis has shown that LIB pattern defects are a major cause of low yield. The prior art PC LIB macro was also impacted by PC continuity which makes it impossible to decouple the PC continuity defects and the LIB continuity defects.

BRIEF SUMMARY

Disclosed is a novel circuit and the inventors call PC LIB open macro used to monitor LIB continuity. The PC LIB open macro which is improves LIB monitoring which significantly reduces the effect of PC continuity by using triple PC structure. Meanwhile, the two structures which contained only CB and CB are proposed to monitor defects in LIB lithograph double patterning.

Disclosed is a novel system and method to form local interconnects in a continuity test structure. The method begins with a first set of transistor gate lines and a second set of transistor gate lines are formed. Next, a first group of two or more local interconnect lines landing on transistor gates and formed substantially perpendicular to the first set of transistor gate lines and electrically coupled therewith is formed using a first lithography pass. A second group of two or more local interconnect lines landing and formed substantially perpendicular to the second set of transistor gate lines and electrically coupled therewith is formed during second lithography pass. In one example, the first group of local interconnect lines includes at least three local interconnect lines. The first set of transistor gate lines is electrically coupled to two different subsets of two local interconnect lines in the first group of three local interconnect lines.

A continuity test is performed between at least two local interconnect lines of the first group to identify any discontinuity in any of the first group of two or more local interconnect lines.

Also, a continuity test is performed between at least two local interconnect lines of the second group to identify any discontinuity in any of the second group of two or more local interconnect lines.

For some technologies, a third set of transistor gate lines is formed along with a third group of two or more local interconnect lines landing on transistor gates and formed substantially perpendicular to the second set of transistor gate lines and electrically coupled therewith using a third lithography pass. A continuity test is performed between at least two local interconnect lines of the third group to identify any discontinuity in any of the third group of two or more local interconnect lines.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
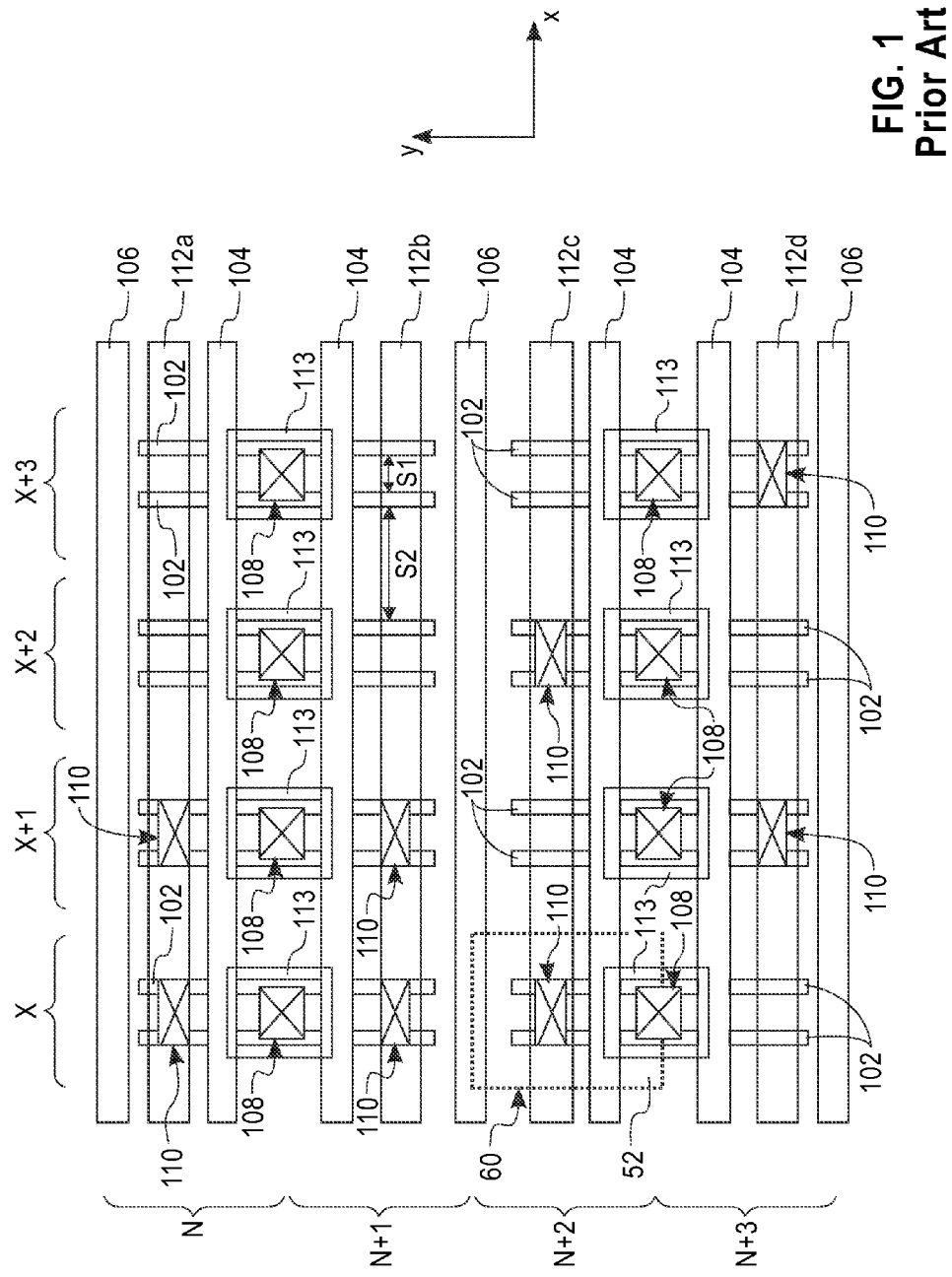
FIG. 1 illustrates a top view of a prior art cell array.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Non-Limiting Abbreviations And Definitions

As used herein defect is imperfection such as a gap or break, typically caused in the lithography process when forming local interconnects.

As used herein HOL is an abbreviation for "health on line" which is yield test structure or yield monitor macro.

As used herein LIA is an abbreviation for "local interconnect contact A" landing on source/drain region of transistor. LIA contains two contacts CA and CC, in which CA is a contact type for source/drain region that is placed typically during the first lithography of LIA and CC is a contact type for source/drain region that is placed typically during the second lithography of LIA.

As used herein LIB is an abbreviation for "local interconnect contact B" landing on a transistor gate. LIB contain three contacts CB, CD, and CF. The three contacts are formed during different passes of lithography process. In the first lithographic pass CB contact that lands on PC is formed. In the second lithographic pass CD contact that lands on PC is formed. And in the third lithographic process CF contact that lands on PC.

As used herein MOL is an abbreviation for "middle on line" which is not a structure, rather it is meant to be part of process flow.

As used herein PC is an abbreviation for "polycrystalline gate" where the gate is a transistor gate.

Array Structure

An array of devices, such as memory cells typically including rows and columns. The rows of the cell matrices are formed in low-resistivity polysilicon. In technological processes providing for two or three metal levels, the polysilicon lines can be parallel-connected to metal lines. This is done to reduce the overall parasitic resistance of the rows and, hence, the propagation delays, according to a technique known as word line metal strapping. The conductive layers providing the matrix rows have to be formed within the word line pitch, that is, placed at sub-micron distances from one another. With current integration technologies providing a high degree of control of the lithographic patterning, the spread of faults from the rows of conductive layers becomes restricted to isolated punctual regions of the matrix.

Referring to FIG. 1, the cell array 100, such as a ROM cell array, further includes various contacts formed on various ROM features. In one embodiment, the cell array 100 includes local interconnect (LIA) drain contacts 108 landing on drains and source contacts 110 landing on sources. In one example, the drain contacts 108 and source contacts 110 are designed with different dimensions and/or geometries.

In the top view, the local interconnect (LIB) for drain contacts of the drain contacts 108 include a first dimension that spans in the gate direction (X direction) and a second dimension that spans in the active region direction (Y direction). The first and second dimensions are substantially equal. In other words, the drain contacts 108 have a symmetric geometry in the X and Y directions. For example, the drain contacts 108 include a square geometry in the top view. In another example, the drain contacts 108 include a round shape in the top view. In the top view, the source contacts 110 include a third dimension that spans in the gate direction (X direction) and a fourth dimension that spans in an active region direction (Y direction). Furthermore, a contact photomask is specifically designed according to a particular design of the cell array. The rest of the patterning photomasks are generically designed.

Furthermore, the sources of the transistors in one cell are electrically connected together, and the drains of the transistors in one cell are electrically connected together. In one embodiment, the intra-cell connections can be achieved by local silicide features. In furtherance of the present embodiment, the semiconductor substrate includes silicon, and the silicide is formed on the sources (and/or drains) to reduce contact resistance. As an epitaxy silicon is formed on the sources (and/or drains), the sources (and/or drains) in one cell are merged together when the shorter space S1 is implemented between adjacent active regions within a cell. Thus, a continuous silicide feature is formed on intra-cell sources (and/or drains). In one example, the contact features are formed by a procedure including: depositing a dielectric layer, etching the dielectric layer to form contact holes, and filling the contact holes with a metal, such as tungsten, aluminum, or copper.

Still referring to FIG. 1, the cell array 100 further includes various metal lines formed in a first metal layer and coupled to respective contacts. In the present embodiment, the cell array 100 includes metal lines 112a, 112b, 112c, and 112d configured in parallel and oriented in one direction (such as the X direction parallel with the gates). More particularly, the metal lines 112a through 112d are Vss power lines and are directly connected to the source contacts 110. The cell array 100 also includes metal lines 113 connected to the drains contacts 108. The metal lines 113 may be formed in the first metal layer. In an embodiment, the metal lines in the metal layer are formed by a damascene process, such as a single damascene process or a dual damascene process. The metal lines 112a through 112d and 113 include copper when the damascene process is implemented. Alternatively, the metal lines 112a through 112d and 113 include aluminum, such as aluminum copper (AlCu) alloy formed by metal deposition and metal patterning.

In one example, the claimed invention may include in a separate test structure of an array is integrated into a device. Advantageously, the separate test structure may be used for local interconnect continuity test. The test structure includes a small array of cells designed like the main cell array 100 inside the device. This separate test structure may be considered a second cell array having a smaller size than the main cell array 100. Yet, even though the second test structure has a smaller size than the main matrix 100 in this described example, other configurations are also possible.

PC LIB Macro

Figure 2:
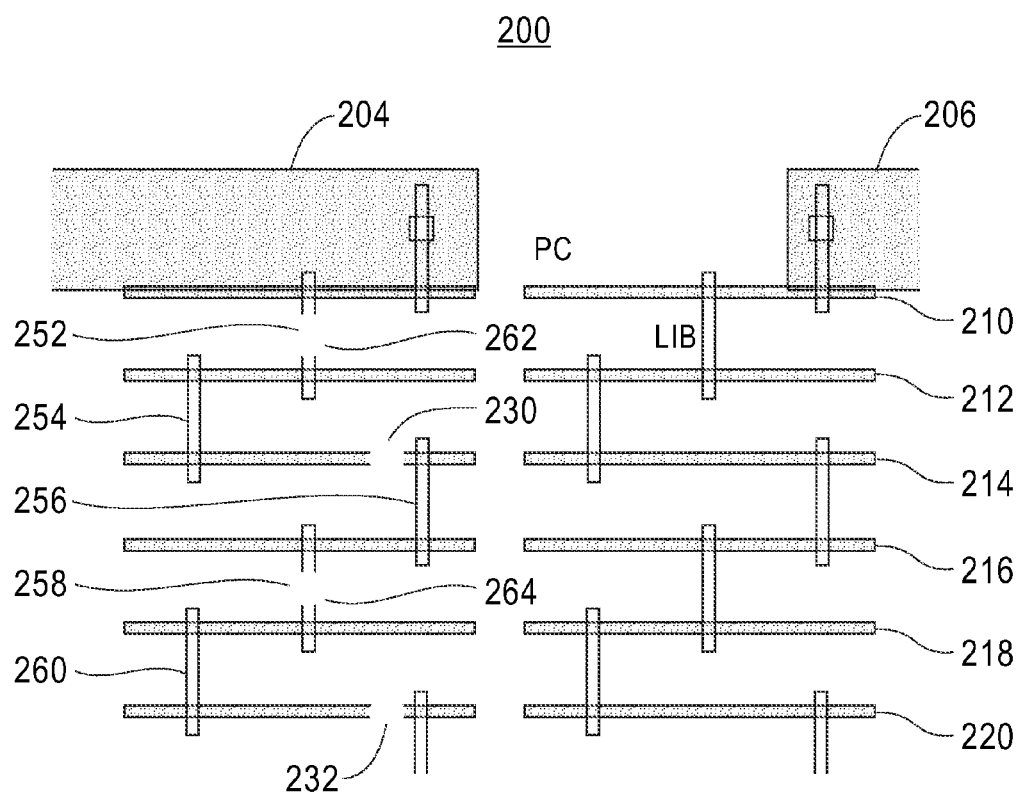
FIG. 2 is a prior art PC LIB macro structure for monitoring the lithography process used to form local interconnects.

FIG. 2 is a prior art PC LIB macro structure 200 for monitoring the lithography process to form local interconnects. Shown is a pattern of 210, 212, 214, 216, 218, and 220 of polycrystalline gates (PC). Shown are two defects 230 and 232 in PC lines 214 and 218 respectively.

Also shown are a series of "local interconnect contact B" (LIB) landing on a transistor gate 252, 254, 256, 258, and 260. LIB are typically solderless contacts. In order to meet the demands of smaller and smaller circuitry, LIB is placed in two or more patterns. For example in 14 nm technology, the two patterns are named CD and CB. Whereas for 14 nm technology, the three patterns are CD, CB, CF. Two defects 262 and 264 in LIB 252 and 258 respectively are shown. Using this technique, it is impossible to decouple the PC defects and LIB defects from each other. Stated differently, it is difficult to tell the source of the lithography process error. When a continuity test is run from pad 204 to LIB line 220 because of the defects both in PC 230, 232 and the defects in LIB 252, 258 there is no ability to isolate these defects. LIB defects and PC defects are both major sources of low yield problems. This makes the source of the problem impossible to isolate.

PC LIB Open Macro

Figure 3:
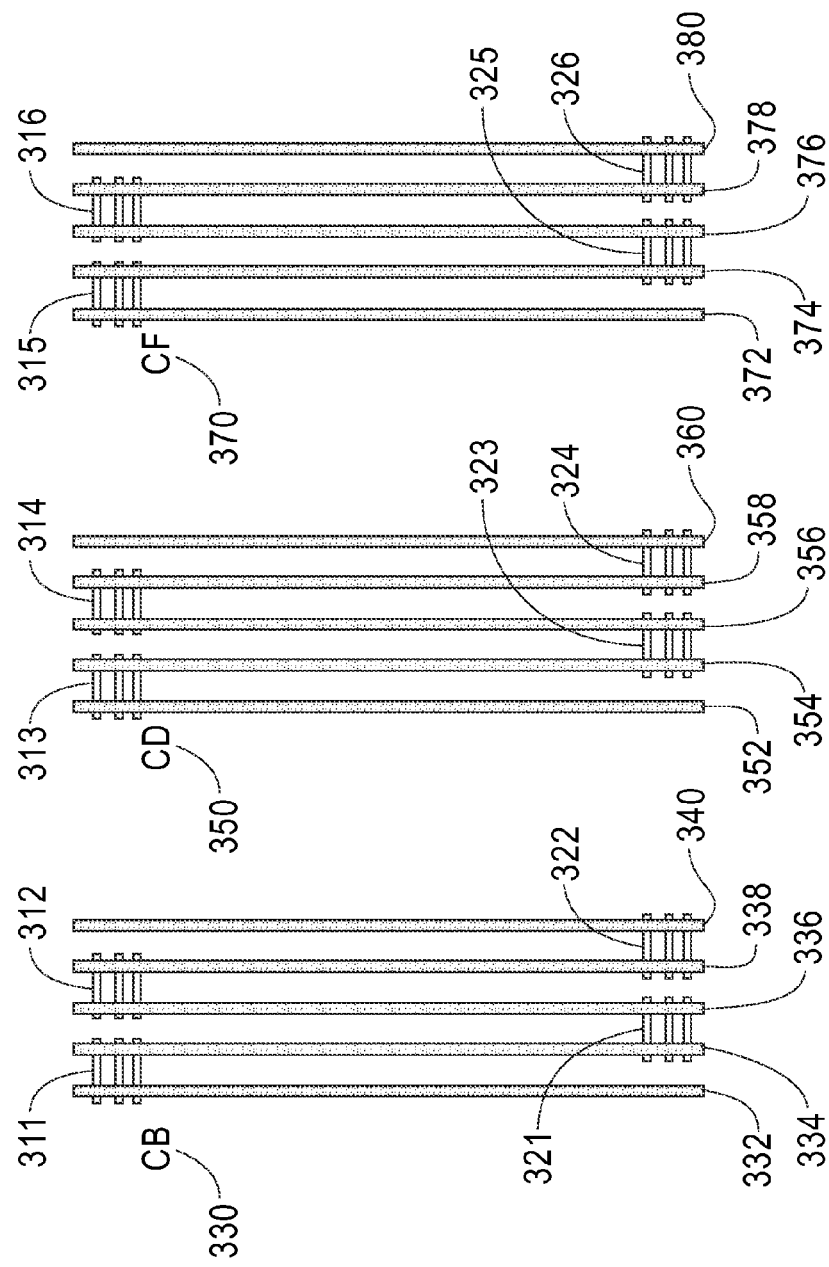
FIG. 3 is an illustration of a PC LIB open macro.

FIG. 3 is a novel PC LIB open macro 300. This PC LIB open macro is better at monitoring defects. This significantly reduces the effect of PC continuity by using double PC structure. In this example three groups of "local interconnects landing on contact B" of the LIB process are labeled as CB 330, CD 350, CF 370. Each of these groups CB, CD, CF represents one pass of the lithography process. Each group has a plurality of local interconnect lines. Specifically, as shown CB has first group of local interconnect lines 332-340 typically formed on a first lithography pass, CD has local interconnect lines 352-360 typically formed on a second lithography pass, and CF has local interconnect lines 370-380 typically formed on a third lithography pass. In this example each of the groups of the LIB lines are shown in groups of five, however other numbers of LIB lines may be used.

Also shown is a set of PC lines. In this example the PC lines are shown in triplicate because the chances of all three PC lines having a yield problem is low. Moreover, the intent is to find defects in LIB. Other conventional methods are used in conjunction with the claimed invention to locate defects in PC and LIB. Further, in other examples each group of the PC lines may include other numbers of lines rather than three as shown e.g. 1 line or more.

To find defects in LIB, a continuity test is applied from CB line 332 to CB line 340. Because the triplicate use of PC lines (311, 312, 321, 322), the probability that a defect contribution is from PC is very low. Hence any discontinuity measured is, with high probability, the result of a defect in LIB in the CB lithography pass. Next, the next group CD of LIB lines are now tested for continuity. Again, because of the triplicate use of PC lines (313, 314, 324, 324), any discontinuity measured between 352 and 360 is the result of a defect in LIB in the CD. Finally, for technologies using a third lithographic pass, the next group CF of LIB lines are now tested. Again, because of the triplicate use of PC lines (315, 316, 325, 326), any discontinuity measured between 370 and 372 is the result of a defect in LIB in the CF.

Example Flow Chart for PC LIB Open Macro

Figure 4:
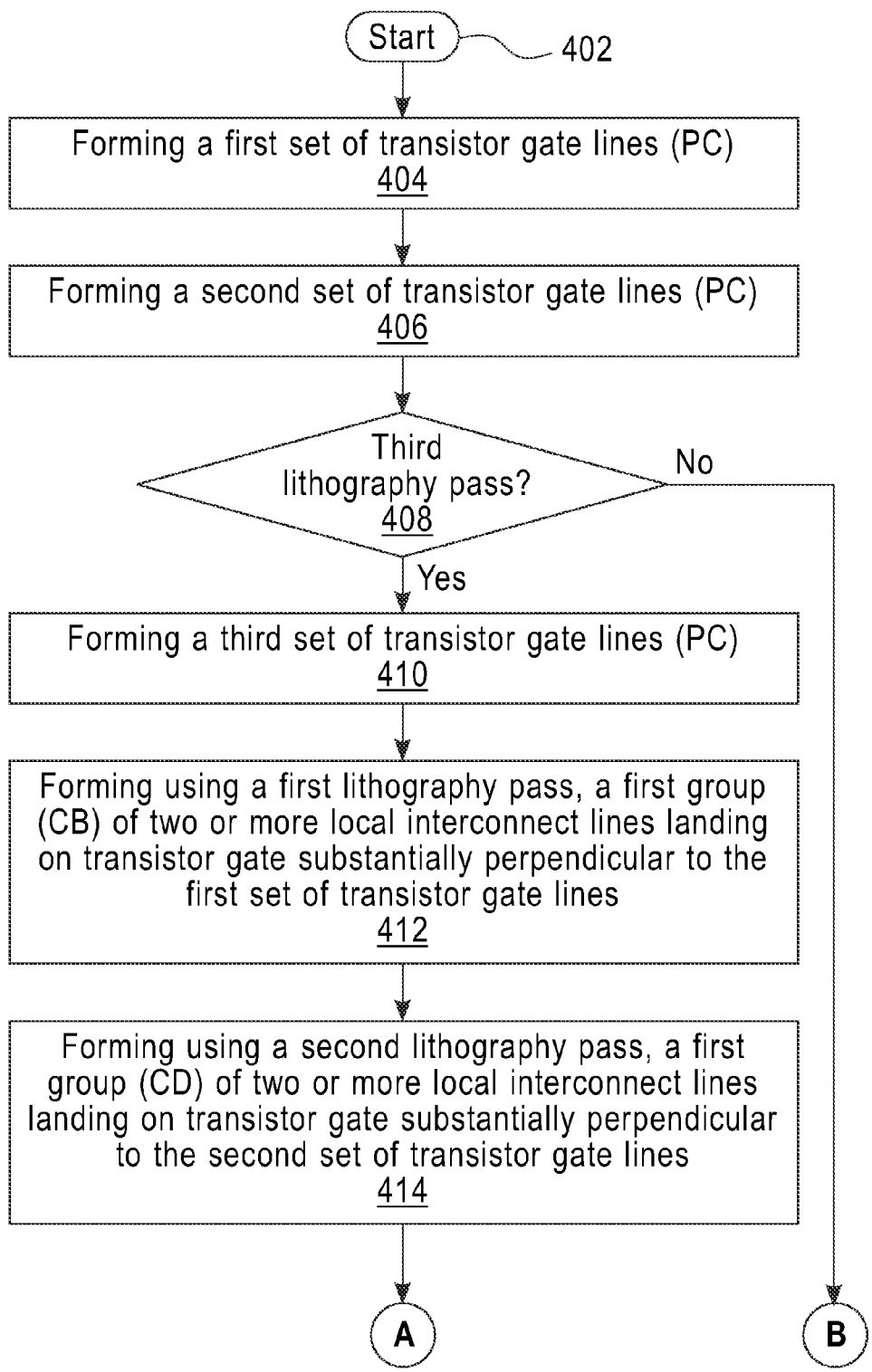
FIG. 4 and FIG. 5 is flow chart of the fabrication and continuity testing using PC LIB open macro of FIG. 3.
Figure 5:
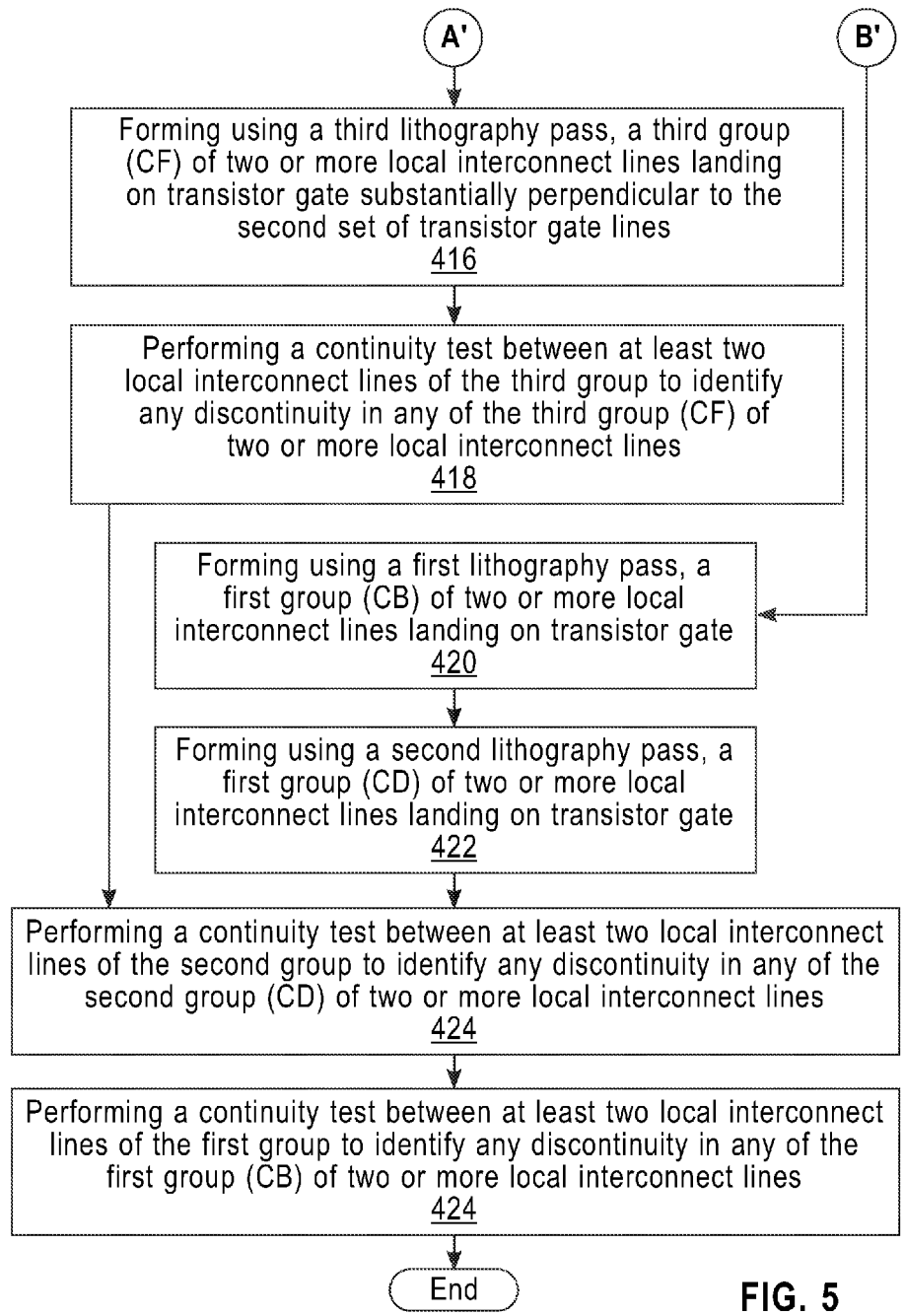

The Lithography process of the present invention is part of a typical method of forming a transistor. For example, the method may include forming one or more transistors on top of a substrate. The substrate may be silicon on insulator (SOI), a bulk silicon substrate, or any other suitable substrate. Furthermore, the transistors may be formed, as being illustrated through a replacement-metal-gate (RMG) process although embodiments of the present invention may be applied to transistors formed through other processes in which PC layer is formed. Follow by the LIB formed during the MOL process. FIG. 4 and FIG. 5 is flow chart of the fabrication and continuity testing using PC LIB open macro of FIG. 3. For simplicity, the details of the typical method forming a transistor not described.

Turning now to FIG. 4 the process starts in step 402 and immediately proceeds to step 404 and 406 which during the RMG process a first set of transistor gate lines (PC) (311, 312, 321, 322) and a second set of transistor gate lines (PC) (313, 314, 323, 324). It is important to note that although these two steps 404 and 406 are shown as separate steps they can be formed as one step during the RMG process.

On one hand, if the technology is using a third lithography pass in step 408, a third set of transistor gate lines (PC) (315, 316, 325, 326) in step 410 is also formed. Again, although this step is separate, it can be formed during one step of the RMG process along with steps 404 and 406. Next a first lithography pass in step 412 forms LIB group CB (332, 334, 336, 338, 340). In step 414, a second lithography pass forms LIB group CD (352, 354, 356, 358, 360). Step 416, a third lithography pass forms LIB group CF (372, 374, 376, 378, 370). A continuity test in step 418 between two local interconnects lines of the third group is performed to identity any discontinuities in the third group CF and the process continues to step 424.

On the other hand, if the technology is not using a third lithography pass in step 408, a first lithography pass in step 420 forms LIB group CB (332, 334, 336, 338, 340). In step 422, a second lithography pass forms LIB group CD (352, 354, 356, 358, 360). Step 416, a third lithography pass forms LIB group CF (372, 374, 376, 378, 370). A continuity test in step 424 between two local interconnects lines of the first group can is performed to identity any discontinuities in the first group CD. A continuity test in step 426 between two local interconnects lines of the first group can is performed to identity any discontinuities in the first group CB.

Using either a two pass or three pass lithography manufacturing process, discontinuities in LIB can be identified in two or more of the local interconnect lines CD, CB, CF. Moreover, the process disclosed to locate discontinuities in LIB can be combined with other prior art methods to locate discontinuities in LIA.

Non-Limiting Design

Figure 6:
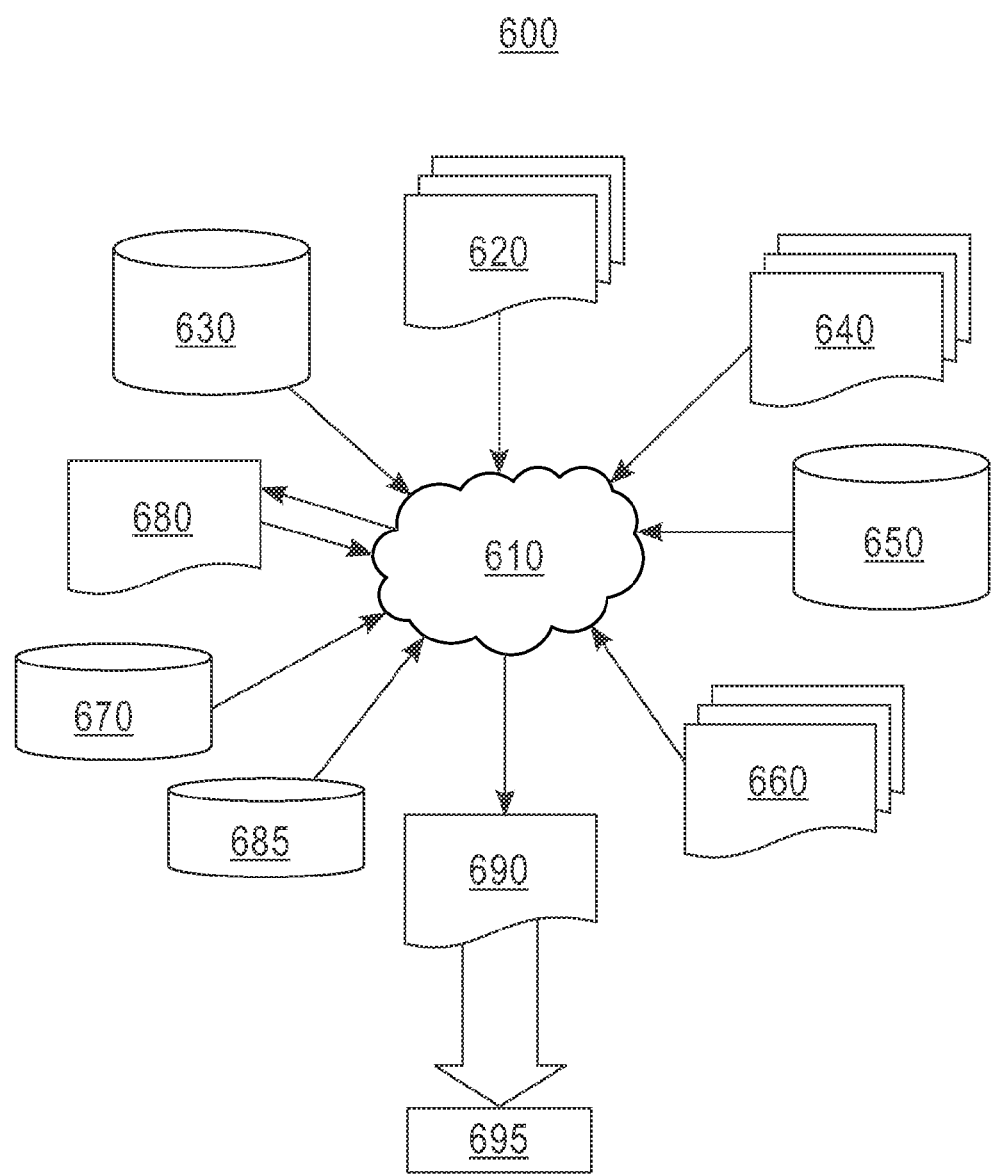
FIG. 6 is a block diagram of an exemplary design flow used for example, in semiconductor IC logic design, simulation, test, layout, and manufacture.

FIG. 6 shows a block diagram of an exemplary design flow 600 used for example, in semiconductor IC logic design, simulation, test, layout, and manufacture. Design flow 600 includes processes and mechanisms for processing design structures or devices to generate logically or otherwise functionally equivalent representations of the design structures and/or devices described above and shown in FIGS. 1-5. The design structures processed and/or generated by design flow 600 may be encoded on computer-readable transmission or storage media to include data and/or instructions that when executed or otherwise processed on a data processing system generate a logically, structurally, mechanically, or otherwise functionally equivalent representation of hardware components, circuits, devices, or systems. Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 600 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown in FIGS. 1-5. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 1-5 to generate a netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 690 may comprise a compiled, executable HDL simulation model that functionally simulates the devices shown in FIGS. 1-5.

Design structure 690 may also employ a data format used for the exchange of layout data of integrated circuits and/or symbolic data format (e.g., information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 690 may then proceed to a stage 695 where, for example, design structure 690: proceeds to tape-out, is released to manufacturing, is released to a mask house, is sent to another design house, is sent back to the customer, etc.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/ dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method to form local interconnects in a continuity test structure, the method comprising:
    forming a set of first transistor gate lines comprising multiple subsets of first transistor gate lines, each subset of first transistor gate lines comprising multiple parallel first transistor gate lines;
    forming a set of second transistor gate lines comprising multiple subsets of second transistor gate lines, each subset of second transistor gate lines comprising multiple parallel second transistor gate lines;
    forming, using a first lithography pass, a group of first local interconnect lines formed substantially perpendicular to the set of first transistor gate lines and electrically coupled therewith, the group of first local interconnect lines being formed such that each subset of first transistor gate lines is only contacted by a pair of adjacent first local interconnect lines and such that each first local interconnect line has at least one end that contacts one of the multiple subsets of first transistor gate lines; and
    forming, using a second lithography pass, a group of second local interconnect lines formed substantially perpendicular to the set of second transistor gate lines and electrically coupled therewith, the group of second local interconnect lines being formed such that each subset of second transistor gate lines is contacted by a pair of adjacent second local interconnect lines and such that each second local interconnect line has at least one end that contacts one of the multiple subsets of second transistor gate lines.

2. The method of claim 1, the forming, using the first lithography pass, of the group of first local interconnect lines comprising forming at least three first local interconnect lines.

3. The method of claim 1, the forming, using the second lithography pass, of the group of second local interconnect lines comprising forming at least three second local interconnect lines.

4. The method of claim 1, the multiple subsets of first transistor gate lines each comprising three first transistor gate lines and the multiple subsets of second transistor gate lines each comprising three second transistor gate lines.

5. The method of claim 1, the multiple subsets of first transistor gate lines comprising four subsets of first transistor gate lines and the group of first local interconnect lines comprise five first local interconnect lines.

6. The method of claim 1, the multiple subsets of second transistor gate lines comprising four subsets of second transistor gate lines and the group of second local interconnect lines comprise five first local interconnect lines.

7. The method of claim 1, further comprising:
    forming a set of third transistor gate lines comprising multiple subsets of third transistor gate lines, each subset of third transistor gate lines comprising multiple parallel third transistor gate lines; and
    forming using a third lithography pass, a group of third local interconnect lines landing on transistor gates and formed substantially perpendicular to the set of third transistor gate lines and electrically coupled therewith, the group of third local interconnect lines being formed such that each subset of third transistor gate lines is only contacted by a pair of adjacent third local interconnect lines and such that each third local interconnect line has at least one end that contacts one of the multiple subsets of third transistor gate lines.

8. The method of claim 7, the multiple subsets of third transistor gate lines comprising four subsets of third transistor gate lines and the group of third local interconnect lines comprise five third local interconnect lines.

9. The method of claim 1, further comprising: identifying, in any of the group of first local interconnect lines and the group of second local interconnect lines, any discontinuity indicating a defect comprising a gap or a break in a local interconnect line, the identifying being performed by performing continuity testing.

10. The method of claim 9, the multiple subsets of first transistor gate lines each comprising at least three first transistor gate lines and the multiple subsets of second transistor gate lines each comprising at least three second transistor gate lines and the performing of the continuity testing comprising:
    applying a first continuity test across all the first local interconnect lines in the group of first local interconnect lines, the three first transistor gate lines in each of the multiple subsets of first transistor gate lines ensuring that any discontinuity measured during the first continuity test is more likely to be in the first local interconnect lines than in the first transistor gate lines; and applying a second continuity test across all the second local interconnect lines in the group of second local interconnect lines, the three second transistor gate lines in each of the multiple subsets of second transistor gate lines ensuring that any discontinuity measured during the second continuity test is more likely to be in the second local interconnect lines than in the second transistor gate lines.

11. A method comprising:

forming a set of first transistor gate lines comprising multiple subsets of first transistor gate lines, each subset of first transistor gate lines comprising multiple parallel first transistor gate lines;

forming a set of second transistor gate lines comprising multiple subsets of second transistor gate lines, each subset of second transistor gate lines comprising multiple parallel second transistor gate lines;

forming, using a first lithography pass, a group of first local interconnect lines formed substantially perpendicular to the set of first transistor gate lines and electrically coupled therewith, the group of first local interconnect lines being formed such that each subset of first transistor gate lines is only contacted by a pair of adjacent first local interconnect lines and such that each first local interconnect line has at least one end that contacts one of the multiple subsets of first transistor gate lines;

forming, using a second lithography pass, a group of second local interconnect lines formed substantially perpendicular to the set of second transistor gate lines and electrically coupled therewith, the group of second local interconnect lines being formed such that each subset of second transistor gate lines is contacted by a pair of adjacent second local interconnect lines and such that each second local interconnect line has at least one end that contacts one of the multiple subsets of second transistor gate lines; and identifying, in any of the group of first local interconnect lines and the group of second local interconnect lines, a discontinuity indicating a defect comprising a gap or a break in a local interconnect line, the identifying being performed by performing continuity testing.

12. The method of claim 11, the forming, using the first lithography pass, of the group of first local interconnect lines comprising forming at least three first local interconnect lines.

13. The method of claim 11, the forming, using the second lithography pass, of the group of second local interconnect lines comprising forming at least three local interconnect lines.

14. The method of claim 11, the multiple subsets of first transistor gate lines comprising four subsets of first transistor gate lines and the group of first local interconnect lines comprise five first local interconnect lines.

15. The method of claim 11, the multiple subsets of second transistor gate lines comprising four subsets of second transistor gate lines and the group of second local interconnect lines comprise five first local interconnect lines.

16. The method of claim 11, further comprising:

forming a set of third transistor gate lines comprising multiple subsets of third transistor gate lines, each subset of third transistor gate lines comprising multiple parallel third transistor gate lines; and forming, using a third lithography pass, a group of third local interconnect lines landing on transistor gates and formed substantially perpendicular to the set of third transistor gate lines and electrically coupled therewith, the group of third local interconnect lines being formed such that each subset of third transistor gate lines is only contacted by a pair of adjacent third local interconnect lines and such that each third local interconnect line has at least one end that contacts one of the multiple subsets of third transistor gate lines.

17. The method of claim 16, the multiple subsets of third transistor gate lines comprising four subsets of third transistor gate lines and the group of third local interconnect lines comprise five third local interconnect lines.

18. The method of claim 11, the multiple subsets of first transistor gate lines each comprising at least three first transistor gate lines and the multiple subsets of second transistor gate lines each comprising at least three second transistor gate lines and the performing of the continuity testing further comprising:

applying a first continuity test across all the first local interconnect lines in the group of first local interconnect lines, the three first transistor gate lines in each of the multiple subsets of first transistor gate lines ensuring that any discontinuity measured during the first continuity test is more likely to be in the first local interconnect lines than in the first transistor gate lines; and applying a second continuity test across all the second local interconnect lines in the group of second local interconnect lines, the three second transistor gate lines in each of the multiple subsets of second transistor gate lines ensuring that any discontinuity measured during the second continuity test is more likely to be in the second local interconnect lines than in the second transistor gate lines.

* * * * *